United States Patent
Kim

(10) Patent No.: US 7,554,252 B2
(45) Date of Patent: Jun. 30, 2009

(54) PLASMA DISPLAY MODULE INCLUDING ELECTRICALLY CONDUCTIVE MEMBER

(75) Inventor: Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 484 days.

(21) Appl. No.: 11/282,985

(22) Filed: Nov. 21, 2005

(65) Prior Publication Data

US 2006/0109206 A1    May 25, 2006

(30) Foreign Application Priority Data

Nov. 25, 2004  (KR) .................. 10-2004-0097509

(51) Int. Cl.
*H01J 17/49*  (2006.01)
(52) U.S. Cl. ...................................... 313/46; 313/582
(58) Field of Classification Search ......... 313/582–587, 313/46
See application file for complete search history.

(56) References Cited

U.S. PATENT DOCUMENTS

| 5,971,566 A * | 10/1999 | Tani et al. ................. 362/294 |
| 6,255,778 B1 * | 7/2001 | Yoshikawa et al. .......... 313/582 |
| 6,873,105 B2 * | 3/2005 | Akiba ........................ 313/586 |
| 2005/0046618 A1 * | 3/2005 | Kim et al. .................... 345/60 |

FOREIGN PATENT DOCUMENTS

| JP | 2001068031 | 3/2001 |
| JP | 2001242794 | 9/2001 |
| JP | 2001265242 | 9/2001 |
| JP | 2002116700 | 4/2002 |
| JP | 2004326108 | 11/2004 |

* cited by examiner

*Primary Examiner*—Joseph L Williams
(74) *Attorney, Agent, or Firm*—H.C. Park & Associates, PLC

(57) ABSTRACT

A plasma display module includes a plasma display panel, a chassis supporting the plasma display panel, and a conductive member between the plasma display panel and the chassis. The conductive member may reduce the distortion of electrical signals applied to electrodes.

21 Claims, 8 Drawing Sheets

PLASMA DISPLAY MODULE INCLUDING ELECTRICALLY CONDUCTIVE MEMBER

CROSS REFERENCE TO RELATED APPLICATION

This application claims priority to and the benefit of Korean Patent Application No. 10-2004-0097509, filed on Nov. 25, 2004, which is hereby incorporated by reference for all purposes as if fully set forth herein.

BACKGROUND OF THE INVENTION

1. Field of the Invention

The present invention relates to a plasma display module that includes a conductive member that may reduce the distortion of electrical signals applied to electrodes.

2. Description of the Related Art

Generally, plasma display panels display images using gas discharge, and they have excellent display capacity, brightness, contrast, lack of afterimage, and a wide viewing angle. Additionally, the size of the display devices may be easily increased.

In the plasma display panel, a DC or AC voltage applied to electrodes causes ultraviolet rays to be emitted from a discharge gas, the ultraviolet rays excite a fluorescent material, and the fluorescent material emits visible rays to create an image. The purpose of plasma display panels is to create precise images and supply visual information to viewers. Therefore, image quality is a critical feature of the plasma display panel.

Various efforts have been made to improve image quality by fixing structural problems in the plasma display panel such as improving the quality of the fluorescent material arranged inside the plasma display panels, compensating the color-temperature to realize natural color, increasing the contrast ratio, and the like.

Structural improvements have improved image quality, but image quality may also be degraded if the electrical signals corresponding to image signals are distorted. Distorted electrical signals deteriorate the image quality of the plasma display panel because they do not accurately represent input images.

SUMMARY OF THE INVENTION

The present invention provides a plasma display module that includes a conductive member that may reduce or may prevent the distortion of electrical signals applied to the plasma display panel electrodes.

Additional features of the invention will be set forth in the description which follows, and in part will be apparent from the description, or may be learned by practice of the invention.

The present invention discloses a plasma display module including a plasma display panel, a chassis supporting the plasma display panel, and a conductive member arranged between the plasma display panel and the chassis.

The present invention also discloses a plasma display module including a plasma display panel including X and Y electrodes for transmitting electrical signals to generate discharge in the plasma display panel, a chassis arranged at a rear side of the plasma display panel to support the plasma display panel, a circuit unit arranged at a rear side of the chassis and including an X electrode driving unit for applying electrical signals to the X electrodes and a Y electrode driving unit for applying electrical signals to the Y electrodes, and a conductive member arranged between the plasma display panel and the chassis.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
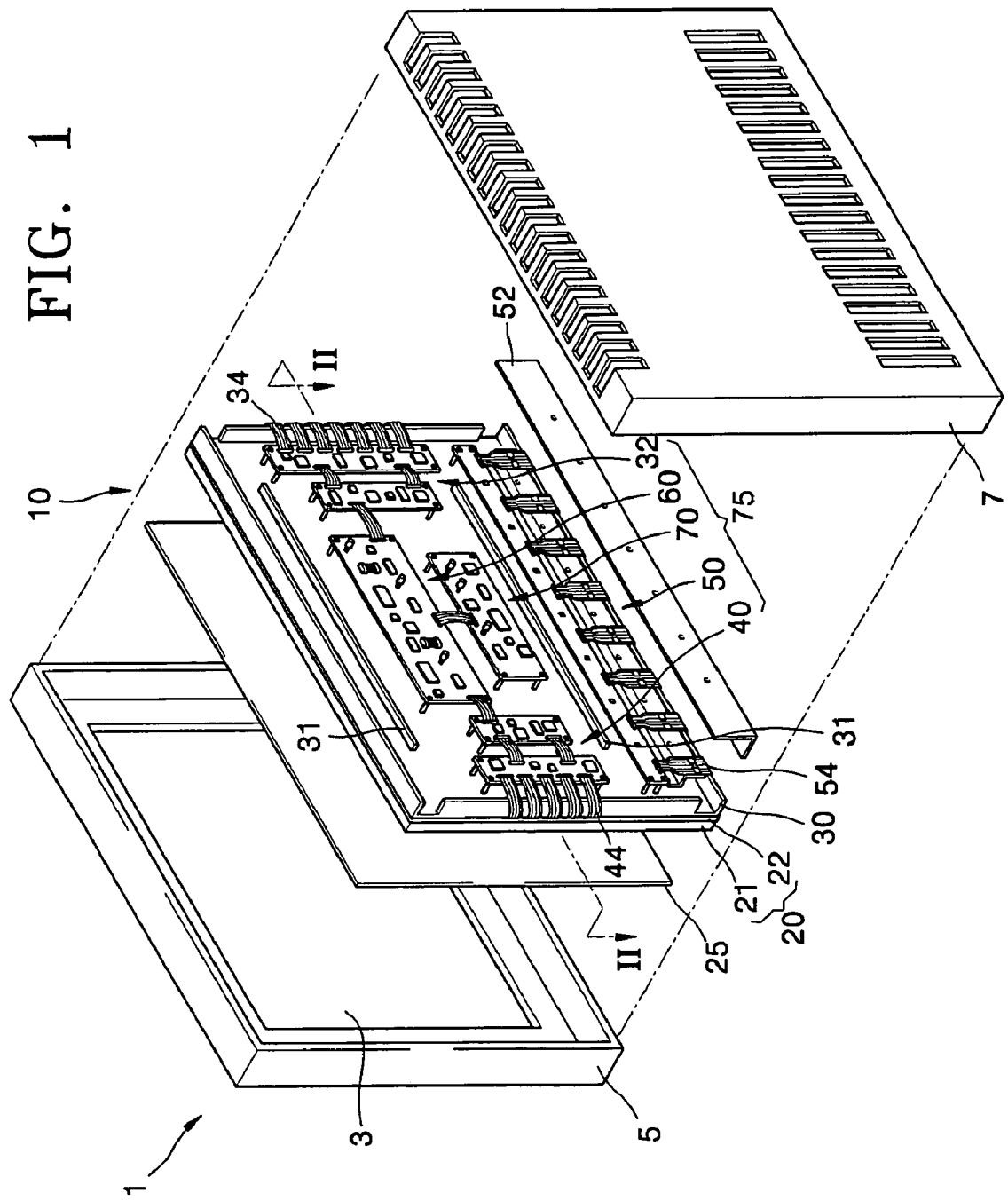
FIG. 1 shows an exploded perspective view of a plasma display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
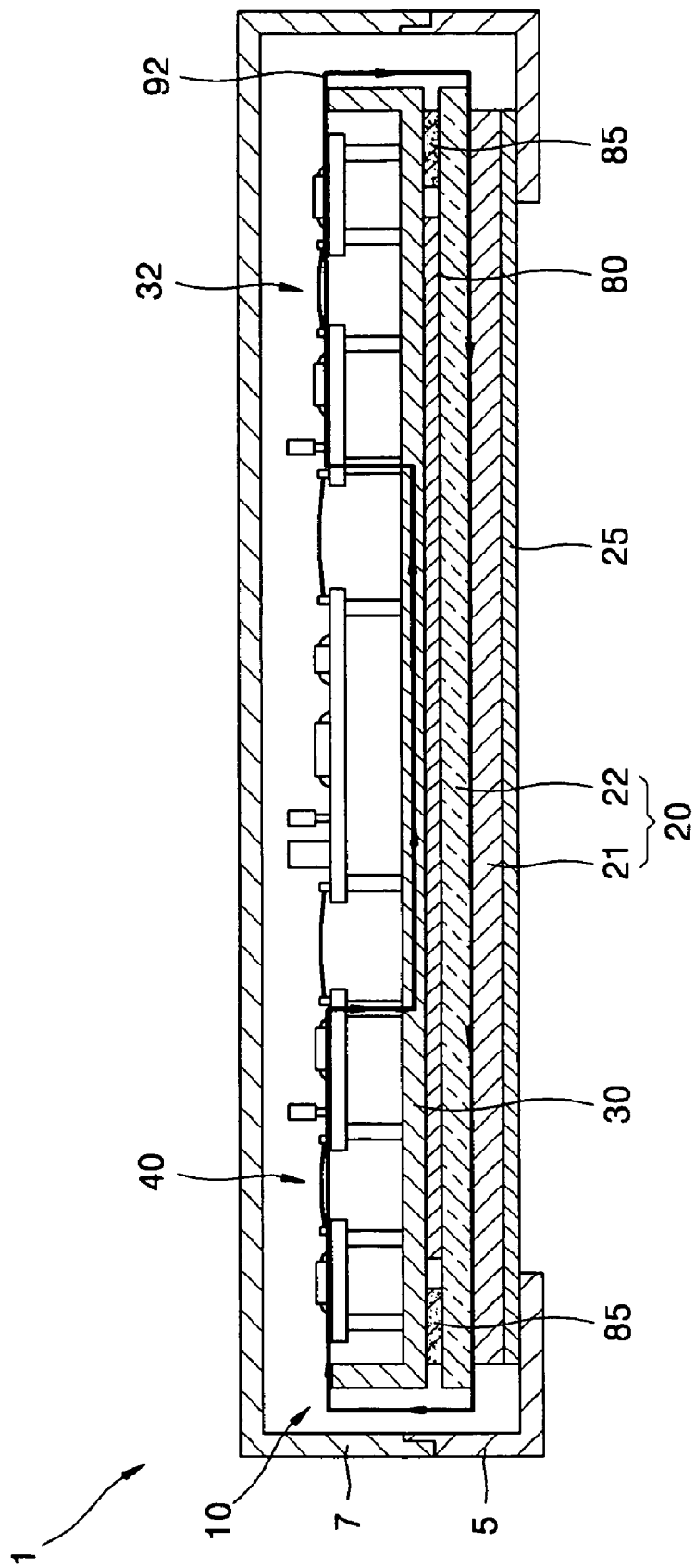
FIG. 2 shows a cutout sectional view taken along Line II-II of the plasma display device according to an exemplary embodiment of the present invention, in which a conductive member is not provided.
Figure 7:
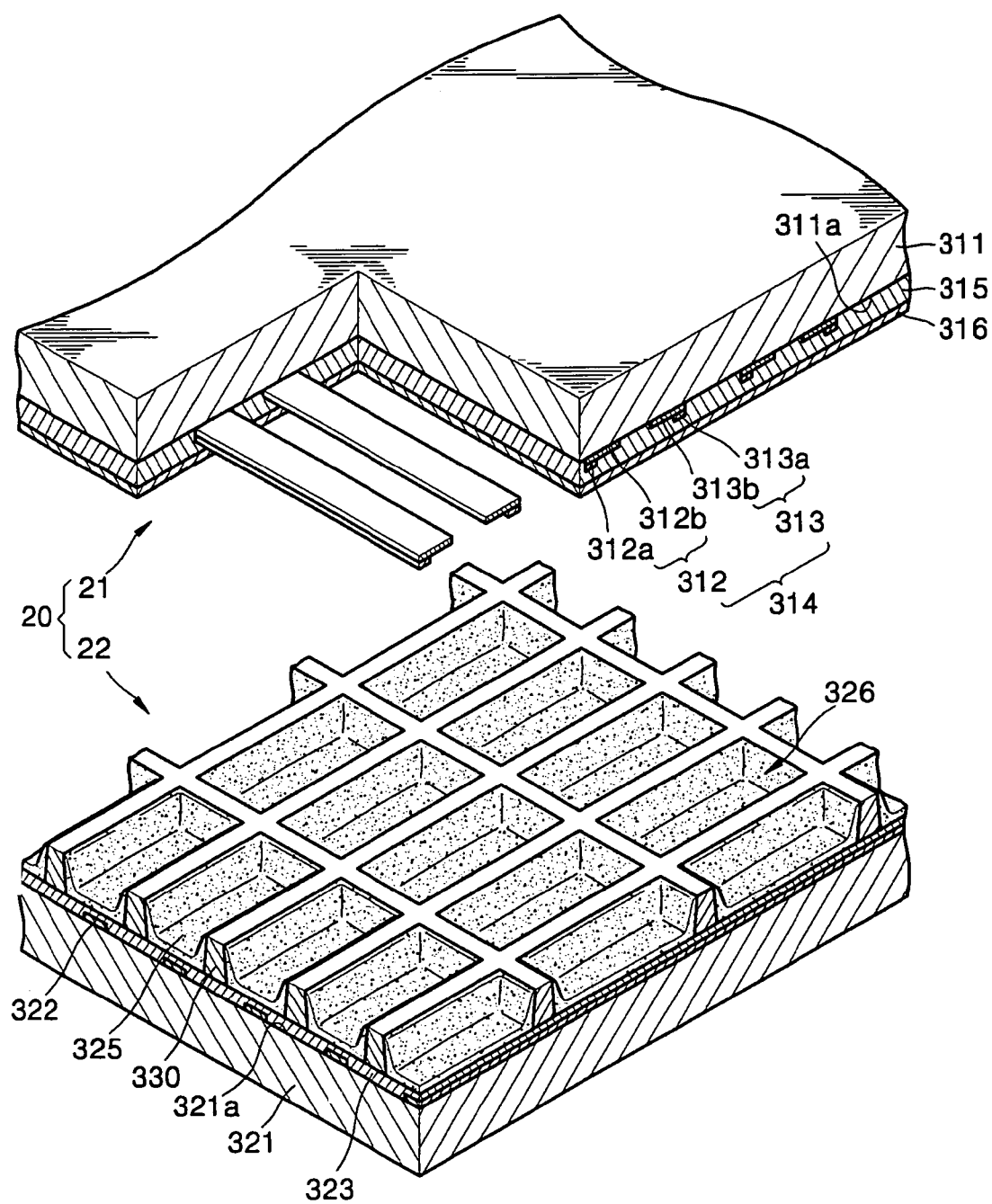
FIG. 7 shows a perspective view of a plasma display panel according to an exemplary embodiment of the present invention.

An exemplary embodiment of the present invention will now be described with reference to FIG. 1, FIG. 2, and FIG. 7.

The plasma display module 10 generates discharges corresponding to external image signals to emit ultraviolet rays, which cause a fluorescent layer 325 to emit visible light and thus create images. The plasma display module 10 includes a display panel that includes a front panel 21 and a rear panel 22. An electromagnetic wave shielding film 25 may be attached to a front surface of the plasma display panel 20. The electromagnetic waves generated during the operation of the plasma display panel 20 may be harmful to the human body, and they may cause other electrical devices to malfunction.

The plasma display panel 20 may include X electrodes 313 and Y electrodes 312 that transmit electrical signals to generate a discharge inside the plasma display panel 20. The X electrodes 313 and the Y electrodes 312 may be arranged parallel to each other. The plasma display panel may further include address electrodes 322 extending in a direction to cross with the X electrodes 313 and the Y electrodes 312. The address electrodes 322 may be omitted.

The electromagnetic shielding film 25 may be attached to the front surface of the plasma display panel 20, or it may be coupled to an additional reinforced glass and then fixed to the front cabinet 5. In this case, a filter holder (not shown) may be fixed to a rear side of the front cabinet 5. An electromagnetic wave shielding filter (not shown) may be formed by connecting the electromagnetic wave shielding film 25 to a reinforced glass (not shown) and may be fixed to the filter holder.

The plasma display module 10 may include a chassis 30 that supports the plasma display panel 20. The chassis 30 may be arranged at a rear side of the plasma display panel 20 and may be made of thermally conductive material such as aluminium or the like.

The chassis 30 may prevent the temperature of the plasma display panel 20 from rising over a predetermined level by conducting heat from the plasma display panel 20 to the outside. The chassis 30 may prevent heat or external impacts from deforming or damaging the plasma display panel 20.

The plasma display module 10 may include a heat conductive sheet 80 arranged between the plasma display panel 20 and the chassis 30 to uniformly conduct heat generated at the plasma display panel 20 to the chassis 30. The heat conductive sheet 80 may be attached directly to the plasma display panel 20 and the chassis 30. The heat conductive sheet 80 may be made of thermally conductive silicone.

The chassis 30 should have sufficient strength to support the plasma display panel 20 and prevent the plasma display panel 20 from being deformed or damaged. The plasma display module 10 m ay include a reinforcing member 31 arranged at a rear surface of the chassis 30 to reinforce the strength of the chassis 30.

The plasma display module 10 may also include double-sided tape 85 arranged between the plasma display panel 20 and the chassis 30 to fix the plasma display panel 20 to the chassis 30.

Furthermore, the plasma display module 110 may include a circuit unit 75 arranged at a rear side of the chassis 30 to drive the plasma display panel 20. The circuit unit 75 may include an X electrode driving unit 40, a Y electrode driving unit 32, and an address electrode driving unit 50 that apply electrical signals corresponding to image signals to the X electrodes 313, the Y electrodes 312, and the address electrodes 322, respectively. The electrical signals may be applied to the X electrodes 313, the Y electrodes 312, and the address electrodes 322 in the form of electric potential.

The X electrode driving unit 40 and the Y electrode driving unit 32 may be arranged at positions adjacent to a left edge and a right edge of the chassis 30 when the X electrodes 313 and the Y electrodes 312 are arranged substantially parallel to each other.

The circuit unit 75 may further include a logic control unit 70 and a power supply unit 60. The logic control unit 70 processes external image signals and supplies the processed signal s in the form of electric potential to the X electrode driving unit 40, the Y electrode driving 20 unit 32, and the address electrode driving unit 50. The power supply unit 60 supplies power to the X electrode driving unit 40, the Y electrode driving unit 32, and the address electrode driving unit 50.

The address electrode driving unit 50 may include a plurality of highly-integrated circuit chips, which generate a large amount of heat. The plasma display module 10 may include a cover plate 52 that covers the address electrode driving unit 50 to effectively emit heat.

The plasma display panel apparatus 1 may include the plasma display module 10 and a cabinet that includes a front cabinet 5 and a rear cabinet 7. The plasma display module 10 is arranged between and fixed to the front cabinet 5 and the rear cabinet 7. The cabinet improves the external appearance of the plasma display module 10 and is more convenient fro users.

Distortion of electric signals applied to the electrodes of the plasma display panel 20 in the plasma display module 10 will now be described with reference to FIG. 2 and FIG. 3.

Generally, the plasma display panel 20 includes discharge cells 326 in which discharge occurs. A predetermined electric potential is applied to the X electrodes 313, the Y electrodes 312, and the address electrodes 322 to form electric fields inside the discharge cells 326 that accelerate charged particles.

Various plasma display panel driving schemes may be utilized to realize images. Is An address display separation (ADS) driving scheme, which is a basic driving scheme technology, has been widely used. Hereinafter, the driving of the plasma display panel 20 according to exemplary embodiments of the present invention will be described based on the ADS driving scheme.

Sixty image frames may be displayed each second on the plasma display panel 20 to display images corresponding to external image signals. Each image frame may display one of 256 gray scales. Each image frame should be completely independent of the preceding and following image frames. The sixty image frames together may display one second of motion. The plasma display panel 20, which has an AC, three-electrode surface discharge structure, emits visible light using wall charges accumulated inside the discharge cells 326 due to an address discharge and a sustain discharge. Therefore, an image frame may be divided into eight sub-fields, and each sub-field may include a reset period, an address period, and a sustain period.

A pulse potential that varies with time may be deformed into an appropriate state and be applied to the X electrodes 313, the Y electrodes 312, and the address electrodes 322 to create sixty image frames in one second. It is therefore necessary to apply a large number of pulses to the X electrodes 313 and the Y electrodes 312 in a short time to display a predetermined gray scale, since the X electrodes 313 and the Y electrodes 312 create the sustain discharge.

The pulse potential is an electrical signal applied to the X electrodes 313 and the Y electrodes 312. The pulse potential continuously varies with time and flows from the X electrodes 313 to the Y electrodes 312 even though the X electrodes 313 and the Y electrodes 312 are not in physical contact with each other. The pulse potential generates a magnetic field that also varies with time.

The pulse potential also generates an electric field that varies with time. An electromagnetic wave is generated due to the electric signals applied to the X electrodes 313 and the Y electrodes 312 because the X electrodes 313 and the Y electrodes 312 serve as a resonator such as an antenna, as described by the Maxwell equation.

The electromagnetic wave affects other X electrodes 313 and Y electrodes 312. An induced current induced by the electromagnetic wave and the adjacent X electrodes 313 is generated in the Y electrodes 312 even though the X electrodes 313 and Y electrodes 312 are not electrically connected to each other, because the electromagnetic wave propagates along other media. The electromagnetic wave affects the chassis 30 and other components. FIG. 2 shows an induced current 92 flowing from the X electrode driving unit 40 to the Y electrode driving unit 32.

In the exemplary embodiment described above, the current flows from the X electrodes 313 to the Y electrodes 312 and an induced current is generated that flows from the Y electrodes 312 to the X electrodes 313. However, when the pulse potential changes to cause the current to flow from the Y electrodes 312 to the X electrodes 313, an induced current flowing from the X electrodes 313 to the Y electrodes 312 is generated. The induced current always flows in a direction to oppose the electrical signals applied to the X electrodes 313 and the Y electrodes 312.

Unlike the electrical signals applied to the X and Y electrodes 313 and 312, the induced current 92 is not a signal that corresponds to external image signals, but it is a kind of noise. The induced current 92 flows through the Y electrode driving unit 32, the Y electrodes 312, the X electrodes 313, the X electrode driving unit 40, and the chassis 30 and distorts the electrical signals applied to the X electrodes 313 and the Y electrodes 312.

By reducing the amplitude of the induced current, the electrical signals applied to the X electrodes 313 and the Y electrodes 312 may be processed into signals that more exactly correspond to the image signals, thereby improving image quality of the plasma display panel 20. Therefore, there is a need to decrease the amplitude of the induced current.

The induced current may be thought of as a current flowing through a closed loop that includes the Y electrode driving unit 32, the Y electrodes 313, the X electrodes 312, the X electrode driving unit 40, and the chassis 30. The closed loop serves as an inductor and distorts the electrical signals applied to the X electrodes 313 and the Y electrodes 312. When the inductance of the closed loop inductor is diminished, it is possible to diminish the distortion of the electrical signals applied to the X electrodes 313 and the Y electrodes 312.

Figure 3:
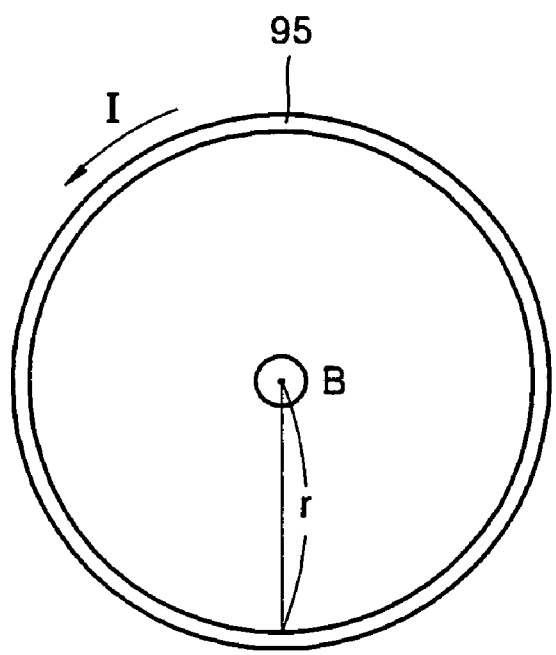
FIG. 3 shows a schematic view of an electromagnetic field generated when a current flows through a circular conducting wire.

FIG. 3 shows a closed loop inductor.

Current "I" flows through the closed loop 95. An electromagnetic field B is generated as shown in FIG. 3. The closed loop 95 may be modeled as a solenoid whose winding number is one. Solenoid type modeling may be applied when the loop 95 is sufficiently long in a vertical direction. The closed loop 95 created by the Y electrode driving unit 32, the Y electrode 313, the X electrode 312, the X electrode driving unit 40, and the chassis 30 may be regarded as a loop sufficiently long in a vertical direction to be modeled as a solenoid. Solenoid type modeling may be applied to understand the process rather than obtain an exact value. Therefore, solenoid type modeling may be applied to the closed loop 95 through which the induced current flows.

The inductance of the solenoid is proportional to the size of its sectional area. In FIG. 2, the inductance is proportional to the sectional area of the closed loop through which the induced current 92 flows.

A plasma display module 110 according to an exemplary embodiment of the present invention will now be described with reference to FIG. 4.

The plasma display module 110 includes a conductive member 90 arranged between the plasma display panel 20 and the chassis 30. The conductive member 90 may electrically connect the chassis 30 with the plasma display panel 20. The electrical connection of the plasma display panel 20 with the chassis 30 may cause the induced current to flow through the chassis 30, the conductive member 90, and the plasma display panel 20.

The plasma display panel 20 may substantially conduct the current generated by the electromagnetic wave through internal polarization, even though the plasma display panel 20 may be made of non-conductive dielectric material such as glass. The conductive member 90 arranged between the chassis 30 and the plasma display panel 20 may thus electrically connect the chassis 30 with the plasma display panel 20.

The heat conductive sheet 80 may be arranged between the plasma display panel 20 and the chassis 30. A conductive member 90 may be arranged to correspond to the X electrode driving unit 40 on an opposite side of the chassis 30 from the X electrode driving unit 40. Another conductive member 90 may be arranged to correspond to the Y electrode driving unit 32 on an opposite side of the chassis 30 from the Y electrode driving unit 32. The conductive members 90 may be arranged between the chassis 30 and the plasma display panel 20 at location 30a and location 30b.

Alternatively, conductive members 90 may be arranged at either location 30a or location 30b, or they may be arranged at two or more locations.

Hereinafter, with reference to FIG. 4, it will be described how the induced current 92 shown in FIG. 2 varies due to an arrangement of the conductive members 90.

Figure 4:
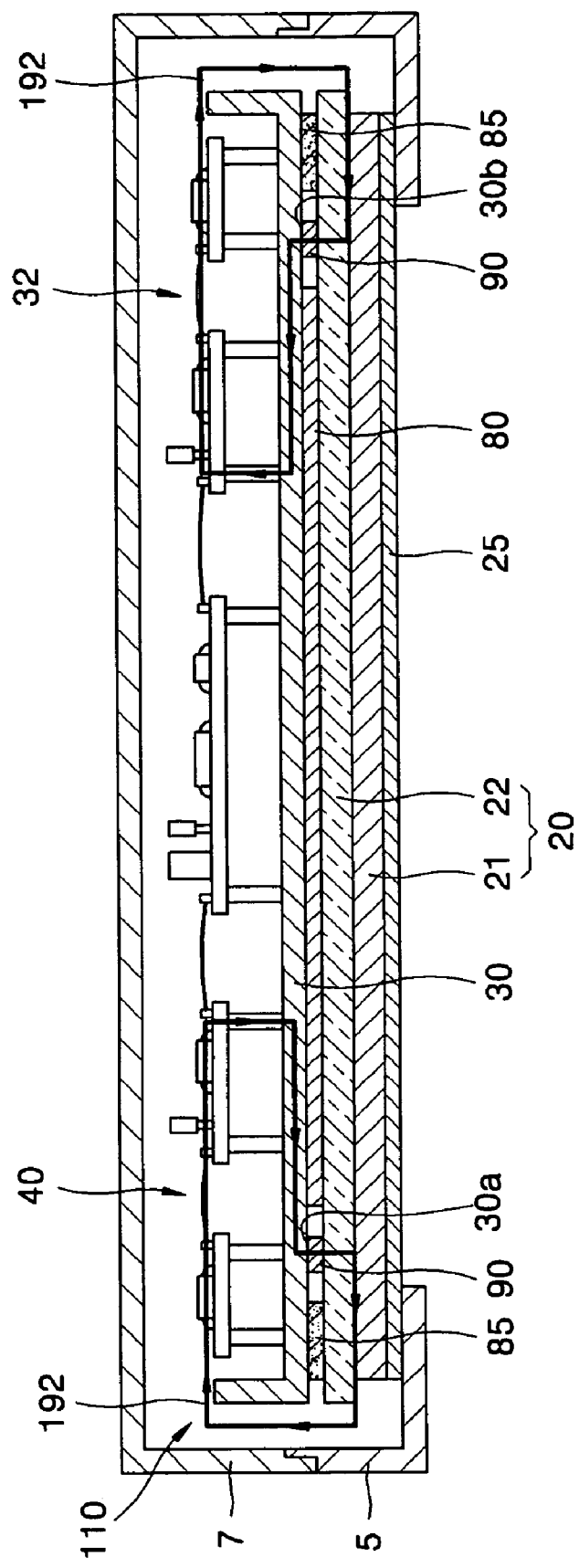
FIG. 4 shows a cutout sectional view taken along Line II-II of the plasma display device according to an exemplary embodiment of the present invention, in which a conductive member is provided.

Referring to FIG. 4, the induced current 192 flows through the Y electrode driving unit 32, the Y electrodes 312, the conductive member 90 arranged between the chassis 30 and the plasma display panel 20 at location 30b, the chassis 30, and back to the Y electrode driving unit 32 to form a closed loop. The induced current 192 flows through the conductive members 90 because free electrons inside the conductive members 90 are affected by electromagnetic waves, and the free electrons flow from the conductive members 90 to the chassis 30. Even though the conductive members 90 are not in physical contact with the Y electrodes 312, since the panel substrates 311 and 321 may act as a dielectric and the induced current also has an alternative property varying with time, the induced current 192 may flow through the conductive member 90.

The conductive member 90 arranged at location 30b diminishes the sectional area of the closed loop of the induced current 192 compared to the closed loop of the induced current 92 generated in the absence of a conductive member 90. The amplitude of the induced current 192 is diminished by reducing the sectional area of the closed loop.

The reduced amplitude of the induced current 192 causes less distortion to the signals applied to the X electrodes 313 and the Y electrodes 312, which improves the image quality of the plasma display panel 20. The improvement of the image quality will be greater in a large plasma display panel 20 because a larger plasma display panel has a closed loop with a larger sectional area, which will create a larger induced current 92 and therefore more signal distortion.

The conductive member 90 arranged at location 30a on the surface of the chassis 30 opposite to the surface on which the X electrode driving unit 40 is arranged will reduce the sectional area of the closed loop through which the induced current 192 can flow and improve the image quality for the same reasons described above with regard to the conductive member 90 arranged at location 30b.

Figure 5:
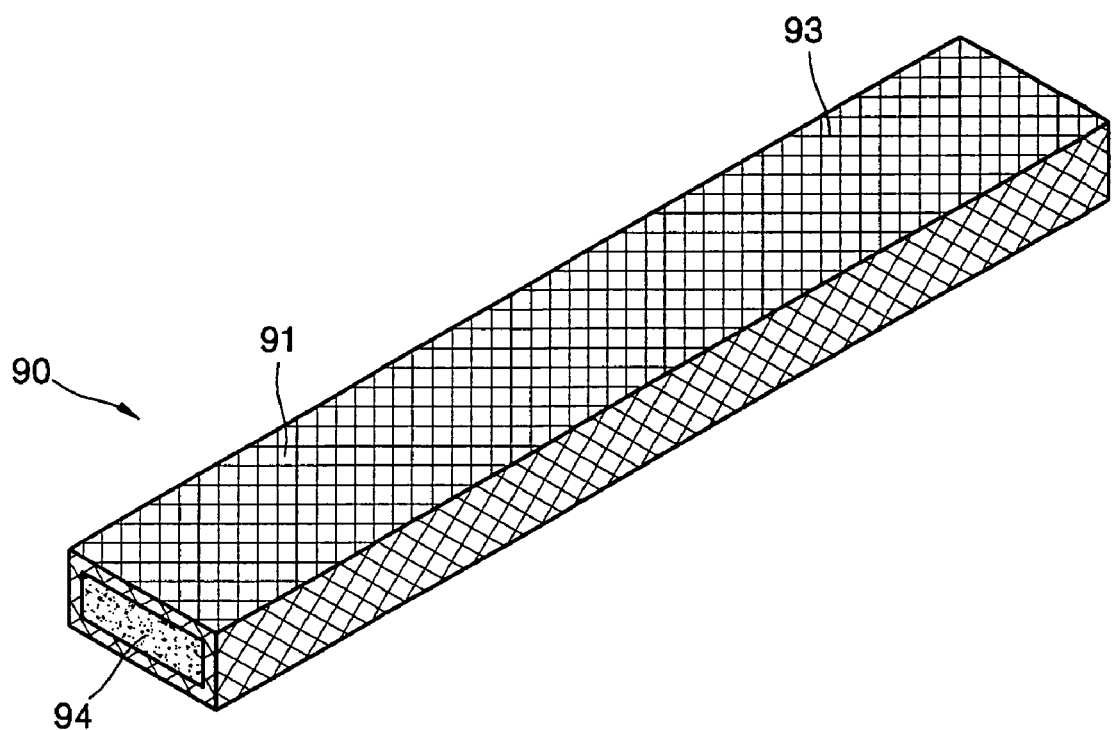
FIG. 5 shows a perspective view of a conductive member according to an exemplary embodiment of the present invention.

FIG. 5 shows an exemplary embodiment of the conductive member 90.

The conductive members 90 may be a metallic thin film made of metal such as Ag, Cu, Cr, or the like. The conductive member 90 may include an impact-absorbing layer 94 surrounded by the conductive material 91. The impact-absorbing layer 94 may absorb impacts which may be applied to the panel 20. The impact-absorbing property of the conductive member 90 may be enhanced by forming the conductive material 91 in the shape of mesh 93.

A plasma display module 210 according to an exemplary embodiment of the present invention will now be described with reference to FIG. 6.

The plasma display module 210 differs from the plasma display module 110 in that the conductive member 90 is arranged at a central portion 30c of a surface of the chassis 30 opposite to a surface on which the X electrode driving unit 40 and the Y electrode driving unit 32 are arranged. A heat conductive sheet 80 is arranged between the plasma display panel and the chassis 30. The heat conductive sheet is not present at the central portion 30c occupied by the conductive member 90. The conductive member 90 may diminish the sectional area of the closed loop of the induced current 292.

Figure 6:
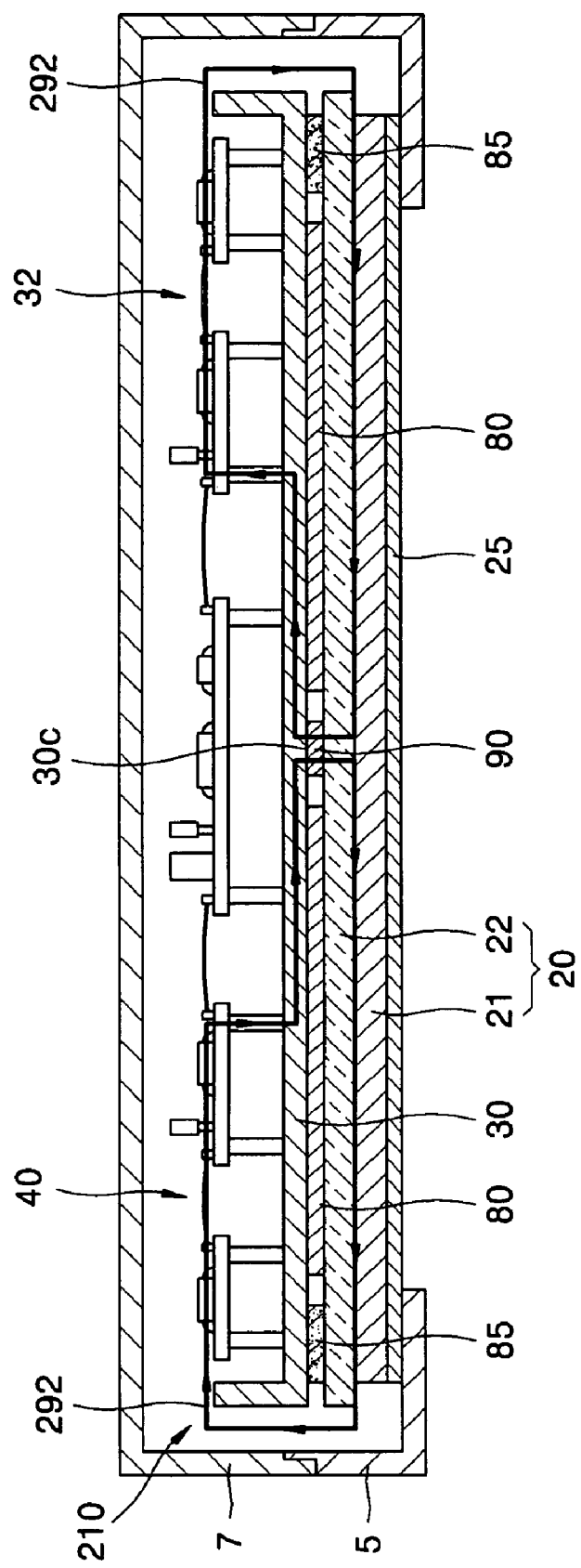
FIG. 6 shows a cutout sectional view taken along Line II-II of the plasma display device according to an exemplary embodiment of the present invention, in which a conductive member is provided.

The conductive member 90 may be arranged at locations other than the central location 30c in FIG. 6. The area of the conductive member 90 may be increased. The heat conductive sheet 80 may be omitted.

A plasma display panel 20 according to an exemplary embodiment of the present invention will now be described with reference to FIG. 7.

The plasma display panel 20 includes a front panel 21 and a rear panel 22. The front panel 21 includes a front substrate 311, pairs of sustain electrodes 314, a front dielectric layer 315 covering the pairs of sustain electrodes 314, and a protective film 316 covering the front dielectric layer 315.

The pairs of sustain electrodes 314 include Y electrodes 312 and X electrodes 313 and are arranged on a rear surface 311a of the front substrate 311. The X electrodes 313 and the Y electrodes 312 extend substantially parallel to each other. The Y electrodes 312 and the X electrodes 313 may be provided with transparent electrodes 312b and 313b made of ITO or the like and metallic bus electrodes 312a and 313a, respectively. The bus electrodes 312a and 313a are electrically connected with the Y electrode driving unit 32 and the X electrode driving unit 40 through a Y electrode connection cable 34 and an X electrode connection cable 44 which are arranged at a right side and a left side, respectively.

The rear panel 320 includes a rear substrate 321, address electrodes 322, a rear dielectric layer 323 covering the address electrodes 322, partition walls 330 formed on the rear dielectric layer 323 to define the discharge cells 326, and fluorescent layers 325 formed inside the discharge cells 326. The address electrodes 322 are arranged on a front surface 321a of the rear substrate 321 and they extend in a direction to intersect the pairs of sustain electrodes 314. The address electrodes 322 are electrically connected with the address electrode driving unit 50 via an electrode connection cable 54.

Discharge gas is included in the discharge cells 326. The discharge gas may include about 10% Xe and an inert gas such as Ne, He, Ar, or a mixture thereof.

Figure 8:
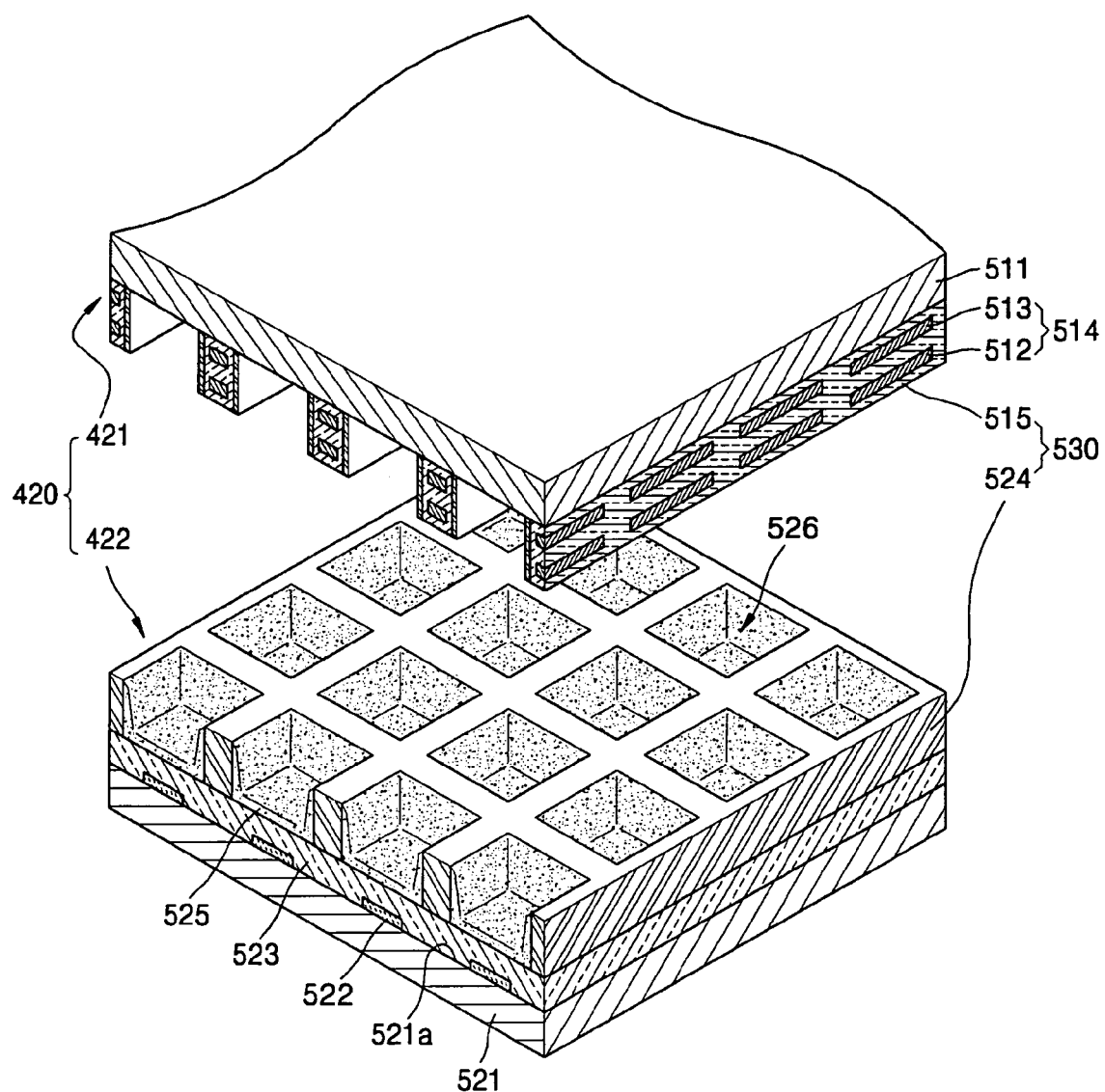
FIG. 8 shows a perspective view of a plasma display panel according to an exemplary embodiment of the present invention.

A plasma display panel 420 according to an exemplary embodiment of the present invention will now be described with reference to FIG. 8.

Unlike the plasma display panel 20, the plasma display panel 420 includes X electrodes 513 and Y electrodes 512 arranged inside the front partition walls 515. The X electrodes 513 and the Y electrodes 512 surround the discharge cells 526. The front partition walls 515 are portions of partition walls 530 made of dielectric material and are arranged on a front panel 421.

The X electrodes 513 and the Y electrodes 512 are arranged parallel to each other and are electrically connected with the X electrode driving unit 40 and the Y electrode driving unit 50 via the X electrode connection cable 44 and the Y electrode connection cable 34, respectively.

Address electrodes 522 are arranged on a front surface 521a of a rear substrate 521 provided on a rear panel 422. The address electrodes extend in a direction to intersect the X electrodes 513 and the Y electrodes 512, and are covered by a rear dielectric layer 523. The address electrodes 522 are electrically connected with the address electrode driving unit 50 via an address connection cable 54.

Fluorescent layers 525 are arranged inside the spaces defined by the rear substrate 521 and rear partition walls 524, which are portions of the partition walls 530. Discharge gas is included in the discharge cells 526. The discharge gas may include about 10% Xe and an inert gas such as Ne, He, Ar, or a mixture thereof.

The plasma display module according to exemplary embodiments of the present invention may include a variety of modified plasma display panels.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display module, comprising:
   a plasma display panel;
   a chassis supporting the plasma display panel;
   an electrically conductive member arranged between the plasma display panel and the chassis, the electrically conductive member contacting the chassis; and
   a heat conductive sheet arranged between the plasma display panel and the chassis,
   wherein the electrically conductive member is disposed in areas not corresponding to areas where the heat conductive sheet is disposed.

2. The plasma display module of claim 1, wherein the electrically conductive member electrically connects the plasma display panel and the chassis.

3. The plasma display module of claim 1, wherein the plasma display panel comprises X electrodes and Y electrodes to transmit electrical signals to generate discharge in the plasma display panel.

4. The plasma display module of claim 3, wherein the plasma display panel is arranged at a front side of the chassis; and
   wherein the plasma display module further comprises a circuit unit arranged at a rear side of the chassis, the circuit unit comprising an X electrode driving unit to apply electrical signals to the X electrodes and a Y electrode driving unit to apply electrical signals to the Y electrodes.

5. The plasma display module of claim 3, wherein the X electrodes and the Y electrodes are arranged substantially parallel to each other, and the plasma display panel further comprises address electrodes that extend in a direction that crosses with the X electrodes and the Y electrodes.

6. The plasma display module of claim 1, wherein the heat conductive sheet comprises a non-conductive material.

7. The plasma display module of claim 1, wherein the electrically conductive member comprises a metallic thin film.

8. The plasma display module of claim 1, wherein the electrically conductive member comprises an impact-absorbing layer and a conductive layer.

9. The plasma display module of claim 8, wherein the impact-absorbing layer is arranged inside the conductive layer.

10. The plasma display module of claim 1, wherein the electrically conductive member has a mesh shape.

11. A plasma display module, comprising:
a plasma display panel comprising X electrodes and Y electrodes to transmit electrical signals to generate discharge in the plasma display panel;
a chassis arranged at a rear side of the plasma display panel to support the plasma display panel;
a circuit unit arranged at a rear side of the chassis, the circuit unit comprising an X electrode driving unit to apply electrical signals to the X electrodes and a Y electrode driving unit to apply electrical signals to the Y electrodes;
an electrically conductive member arranged between the plasma display panel and the chassis, the electrically conductive member contacting the and
a heat conductive sheet arranged between the plasma display panel and the chassis,
wherein the electrically conductive member is disposed in areas not corresponding to areas where the heat conductive sheet is disposed.

12. The plasma display module of claim 11, wherein the X electrodes and the Y electrodes are arranged substantially parallel to each other, and
wherein the plasma display panel further comprises address electrodes extending in a direction that crosses the X electrodes and the Y electrodes.

13. The plasma display module according to claim 11, wherein the electrically conductive member electrically connects the plasma display panel and the chassis.

14. The plasma display module of claim 11, wherein the electrically conductive member is arranged at a position corresponding to the X electrode driving unit.

15. The plasma display module of claim 11, wherein the electrically conductive member is arranged at a position corresponding to the Y electrode driving unit.

16. The plasma display module of claim 11, wherein the electrically conductive members are arranged at positions corresponding to the X electrode driving unit and the Y electrode driving unit, respectively; and
wherein the plasma display module further comprises a heat conductive sheet that is spaced apart from the electrically conductive members.

17. The plasma display module of claim 11, wherein the electrically conductive member is arranged at a central position of the chassis; and wherein a heat conductive sheet is arranged between the plasma display panel and the chassis.

18. The plasma display module of claim 11, wherein the electrically conductive member comprises a metallic thin film.

19. The plasma display module of claim 11, wherein the conductive member comprises an impact-absorbing layer and a conductive layer.

20. The plasma display module of claim 19, wherein the impact-absorbing layer is arranged inside the conductive layer.

21. The plasma display module of claim 11, wherein the electrically conductive member has a mesh shape.

* * * * *